United States Patent
Mo et al.

(10) Patent No.: US 8,399,266 B2
(45) Date of Patent: Mar. 19, 2013

(54) TEST STRUCTURE FOR DETECTION OF GAP IN CONDUCTIVE LAYER OF MULTILAYER GATE STACK

(75) Inventors: Renee T. Mo, Briarcliff Manor, NY (US); Oliver D. Patterson, Poughkeepsie, NY (US); Xing Zhou, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 13/013,133

(22) Filed: Jan. 25, 2011

(65) Prior Publication Data

US 2012/0187400 A1   Jul. 26, 2012

(51) Int. Cl.
  *G01R 31/26* (2006.01)
(52) U.S. Cl. ............. 438/18; 438/14; 438/17; 438/197; 257/48; 257/288; 257/347; 257/E21.531
(58) Field of Classification Search .............. 257/48, 257/288, 347, 351, E21.531; 438/14, 17–18, 438/99, 151, 159, 197, 928
See application file for complete search history.

(56) References Cited

U.S. PATENT DOCUMENTS

| | | | |
|---|---|---|---|
| 4,565,966 A | 1/1986 | Burr et al. |
| 5,189,306 A | 2/1993 | Frei |
| 5,266,901 A | 11/1993 | Woo |
| 5,539,306 A | 7/1996 | Riggio, Jr. |
| 6,297,644 B1 | 10/2001 | Jarvis et al. |
| 6,452,412 B1 | 9/2002 | Jarvis et al. |
| 6,509,197 B1 | 1/2003 | Satya et al. |
| 6,544,802 B1 | 4/2003 | Jun et al. |
| 6,815,959 B2 | 11/2004 | Johnson et al. |
| 6,861,666 B1 | 3/2005 | Weiner et al. |
| 6,921,672 B2 | 7/2005 | Satya et al. |
| 7,026,175 B2 | 4/2006 | Li et al. |
| 7,081,758 B2 | 7/2006 | Umemura et al. |
| 7,340,703 B2 | 3/2008 | Hegazy et al. |
| 7,456,636 B2 | 11/2008 | Patterson et al. |
| 7,474,107 B2 | 1/2009 | Patterson et al. |
| 7,518,190 B2 | 4/2009 | Cote et al. |
| 7,683,644 B2 | 3/2010 | Filippi et al. |

(Continued)

FOREIGN PATENT DOCUMENTS

| | | |
|---|---|---|
| JP | 2004184257 A | 7/2004 |
| JP | 2005210146 A | 8/2005 |

OTHER PUBLICATIONS

J.C. Lee, C.H. Chen, D. Su, J.H. Chuang, "Investigation of Sensitivity Improvement on Passive Voltage Contrast for Defect Isolation", Microelectronics Reliability, vol. 42, No. 9-11, pp. 1707-1710, 2002.

(Continued)

*Primary Examiner* — Evan Pert
*Assistant Examiner* — Mark A Laurenzi
(74) *Attorney, Agent, or Firm* — Cantor Colburn LLP; Ian MacKinnon

(57) ABSTRACT

A semiconductor structure including a test structure for detection of a gap in a conductive layer of the semiconductor structure includes a semiconductor substrate; the test structure, the test structure being located on the semiconductor substrate, the test structure comprising a multilayer gate stack, wherein the multilayer gate stack includes a single conductive layer region including: a gate dielectric located on the semiconductor substrate; the conductive layer located on the gate dielectric; and an undoped amorphous silicon layer located on the conductive layer; and wherein the test structure is configured to detect the presence of the gap in the conductive layer.

8 Claims, 6 Drawing Sheets

U.S. PATENT DOCUMENTS

| | | | |
|---|---|---|---|
| 7,733,109 | B2 | 6/2010 | Ahsan et al. |
| 7,795,879 | B2 | 9/2010 | Watanabe |
| 7,927,895 | B1 | 4/2011 | Lavoie et al. |
| 8,039,837 | B2 | 10/2011 | Patterson et al. |
| 2002/0117696 | A1 | 8/2002 | Hirai et al. |
| 2003/0096436 | A1 | 5/2003 | Satya et al. |
| 2006/0192904 | A1 | 8/2006 | Almogy et al. |
| 2008/0032429 | A1 | 2/2008 | Chen et al. |
| 2008/0100831 | A1 | 5/2008 | Patterson et al. |
| 2008/0217612 | A1 | 9/2008 | Patterson et al. |
| 2008/0237586 | A1 | 10/2008 | Sun et al. |
| 2009/0057644 | A1 | 3/2009 | Shin et al. |
| 2009/0096461 | A1 | 4/2009 | Ahsan et al. |
| 2010/0279436 | A1 | 11/2010 | Fu et al. |

OTHER PUBLICATIONS

M. Matsui, T. Odaka, H. Nagaishi, K. Sakurai, "Quantitative Measurement of Voltage contrast in SEM Images for In-Line Resistance Inspection of Wafers Manufactured for SRAM", Proceedings of the SPIE—The International Society for Optical Engineering, vol. 7272, pp. 72721D (8 pages), 2009.

M. Matsui, Z. Cheng, M. Nozoe, K. Torli, "Detecting Defects in Cu Metallization Structures by Electron-Beam Wafer Inspection", Journal of the Electrochemical Society, vol. 151, No. 6, pp. G440-G442, 2004.

M. Javed et al., "RLC Circuit Response and Analysis (Using State Space Method)," IJCSNS International Journal of Computer Science and Network Security; vol. 8, No. 4, pp. 48-54, Apr. 2008.

EE Times, [online]; [retrieved on Oct. 18, 2011]; retrieved from the Internet http://eetimes.com/design/communications-design/4017914/Accurate-Modeling-of-Spiral-Inductors-on-Silicon-for-Wireless-RFIC-Designs Jan Van Hese, "Accurate Modeling of Spiral Inductors on Silicon for Wireless RFIC Designs," EE Times-Design; pp. 1-9; 2001.

Zhao et al., "Fault-Coverage Analysis Techniques of Crosstalk in Chip Interconnects," IEEE Transactions on Computer-Aided Design of Integrated Circuits and Systems; vol. 22, No. 6, p. 770-782, Jun. 2003.

O.D. Patterson, H. Wildman, D. Gal, K. Wu, "Detection of Resistive Shorts and Opens Using Voltage Contrast Inspection", Micro, vol. 24, No. 5, pp. 67-68, 2006.

T. Sakai, N. Oda, T. Yokoyama, H. Kikuchi, H. Kitajima, "Defect Isolation and Characterization in Contact Array/Chain Structures by Using Voltage Contrast Effect", Conference Proceedings of IEEE International Symposium on Semiconductor Manufacturing Conference, Santa Clara, CA, Oct. 11-13, 1999., pp. 195-198.

400

```
┌─────────────────────────────────────────────────────────┐
│   FORM TEST STRUCTURE INCLUDING MULTILAYER GATE STACK WITH │
│        CONDUCTIVE LAYER ON SEMICONDUCTOR SUBSTRATE      │
│                          401                            │
└─────────────────────────────────────────────────────────┘
                            ⇩
┌─────────────────────────────────────────────────────────┐
│              INDUCE A CHARGE IN THE TEST STRUCTURE       │
│                          402                            │
└─────────────────────────────────────────────────────────┘
                            ⇩
┌─────────────────────────────────────────────────────────┐
│       DETECT GAP IN CONDUCTIVE LAYER IN MULTILAYER GATE STACK │
│                  BASED ON INDUCED CHARGE                │
│                          403                            │
└─────────────────────────────────────────────────────────┘
```

FIG. 4

TEST STRUCTURE FOR DETECTION OF GAP IN CONDUCTIVE LAYER OF MULTILAYER GATE STACK

BACKGROUND

The present invention relates to semiconductor integrated test structures, and more specifically, to in-line test structures for detection of missing conductive layers of a multilayer gate stack in a semiconductor structure.

Semiconductor structures are employing high-k metal gate stacks because they provide better performance at lower power and may avoid leakage resulting from scaling. Hafnium-containing dielectrics are used as gate dielectrics and the gate dielectric is covered by a conductive layer such as titanium nitride (TiN) to protect it during high temperature deposition process of silicon (Si). The conductive layer is then covered by other semiconductor materials, such as an amorphous silicon layer, and may be capped by a silicide cap layer. The gate stack is surrounded by a spacer material. Thus, the conductive layer is typically sealed by the spacer material of the structure. Aggressive cleaning processes are used after the spacer formation process.

One drawback associated with the fabrication process is that if the seal is violated and a path exists to the conductive layer, the conductive layer may be removed during the process. If this occurs, the semiconductor device may not work properly. Detection of a gap in the conductive layer may be challenging using conventional optical or laser-based, voltage contrast (VC), or probable inspection techniques, because the conductive layer may be covered by other semiconductor material layers.

SUMMARY

According to one aspect, a semiconductor structure including a test structure for detection of a gap in a conductive layer of the semiconductor structure includes a semiconductor substrate; the test structure, the test structure being located on the semiconductor substrate, the test structure comprising a multilayer gate stack, wherein the multilayer gate stack includes a single conductive layer region including: a gate dielectric located on the semiconductor substrate; the conductive layer located on the gate dielectric; and an undoped amorphous silicon layer located on the conductive layer; and wherein the test structure is configured to detect the presence of the gap in the conductive layer.

According to one aspect, a method of detection of a gap in a conductive layer of a semiconductor structure includes forming a test structure on a semiconductor substrate, the test structure comprising a multilayer gate stack, wherein the multilayer gate stack includes a single conductive layer region including: a gate dielectric located on the semiconductor substrate; the conductive layer located on the gate dielectric; and an undoped amorphous silicon layer located on the conductive layer; inducing a charge in the test structure; and detecting the presence of the gap in the conductive layer using the charge induced in the test structure.

According to one aspect, a method of detection of a gap in a conductive layer of a semiconductor structure includes forming a test structure on a semiconductor substrate, the test structure comprising a multilayer gate stack, wherein the multilayer gate stack includes a single conductive layer region including: a gate dielectric located on the semiconductor substrate; the conductive layer located on the gate dielectric; and an undoped amorphous silicon layer located on the conductive layer; determining a resistance of the multilayer gate stack of the test structure; and detecting the gap based on the determined resistance.

According to other embodiments of the present invention, methods for forming the test structures mentioned above are also provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 is a flowchart illustrating an embodiment of a method of detecting a gap in a conductive layer in a multilayer gate stack in a semiconductor structure via voltage contrast inspection.

DETAILED DESCRIPTION

Embodiments of the present invention provide test structures for implementing a method of detecting an electrical open indicating a gap in a conductive layer of a multilayer gate stack during the fabrication of a semiconductor structure using voltage contrast (VC) and probable inspection techniques. According to one embodiment of the present invention, a test structure is used to detect one or more gaps in a conductive layer of a multilayer gate stack formed on a semiconductor structure. Such a test structure detects gaps in the conductive layer by eliminating other conductive layers in single conductive layer regions of the semiconductor structure.

Figure 1A:
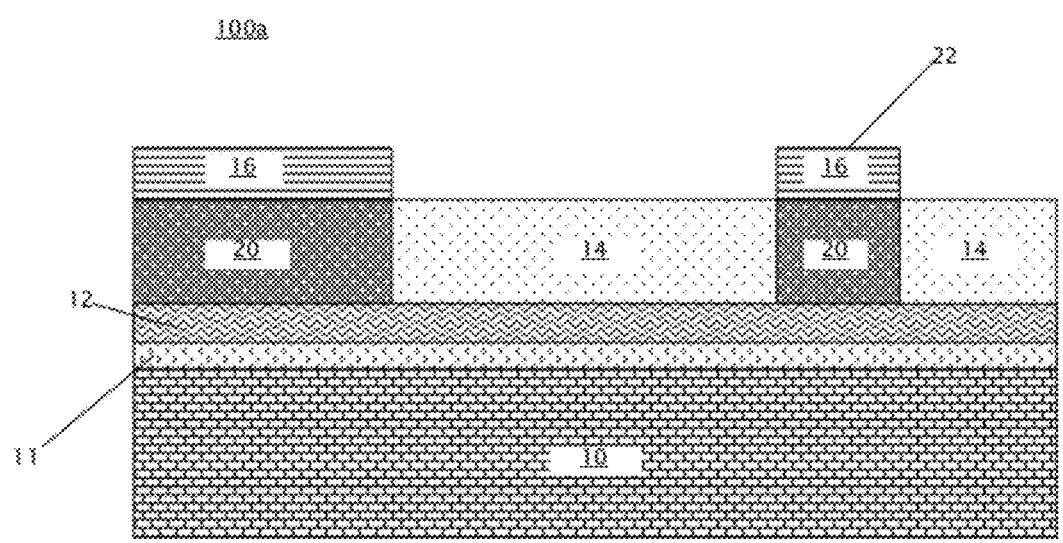
FIG. 1a is a diagram illustrating a cross-sectional view of a semiconductor structure that can be implemented within embodiments of the present invention.
Figure 1B:
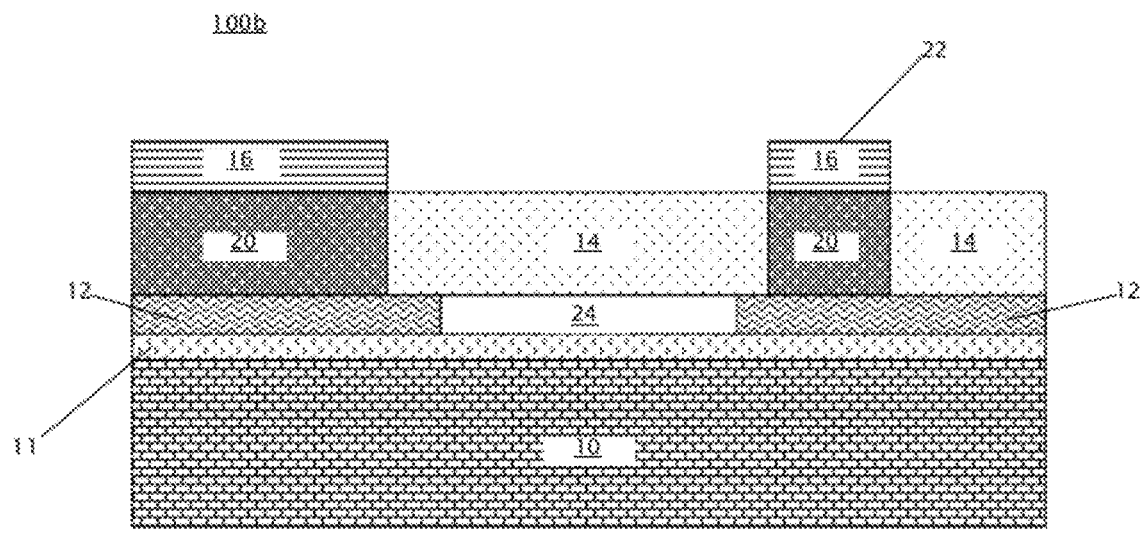
FIG. 1b is a diagram illustrating a cross-sectional view of a semiconductor structure including a gap in a conductive layer that can be implemented within embodiments of the present invention.

FIGS. 1a-b illustrate cross-sections 100a-b of a semiconductor structure including a multilayer gate stack that comprises a test structure located on a semiconductor substrate. As shown, a semiconductor substrate 10 is provided. The semiconductor substrate 10 may include any appropriate semiconductor substrate, including but not limited to silicon (Si), silicon-on-insulator (SOI), silicon or germanium in crystal, polycrystalline, or an amorphous structure, a compound semiconductor including silicon carbide, gallium arsenic, gallium phosphide, indium phosphide, indium arsenide, and indium antimonide or an alloy semiconductor. Active regions separated by passivation regions (discussed in further detail below with respect to FIGS. 2 and 3) are formed within the semiconductor substrate 10. These active regions may include any number and type of active microelectronic devices in various embodiments.

The multilayer gate stack includes a dielectric layer 11 formed over the semiconductor substrate 10, and a conductive layer 12 formed over the gate dielectric layer 11. Conductive layer 12 may comprise a relatively thin layer of TiN or other appropriate conductive material in various embodiments. Conductive layer 12 as shown in FIG. 1a is continuous; in FIG. 1b, a gap 24, indicating that a portion of conductive layer 12 is missing, is shown in conductive layer 12. The multilayer gate stack further includes an amorphous silicon layer, including undoped amorphous silicon 14 and doped amorphous silicon layer 20, formed on the conductive layer 12, and a silicide cap layer 16 formed on top of the doped amorphous silicon layer 20. During fabrication, a mask may be used to block implantation of dopants in the undoped amorphous silicon layer 14, and to block formation of silicide cap layer 16 on undoped amorphous silicon layer 14.

The test structure may include periodic taps to the top surface of silicide cap layer 16, as indicated by arrow 22, for voltage contrast inspection in some embodiments. This electrical signal received by the test structure at these taps indicates a potential of the multilayer gate stack including the conductive layer 12, so that during testing, an electrical open in conductive layer 12 (such as gap 24, as shown in FIG. 1b) may be accurately detected.

Figure 2:
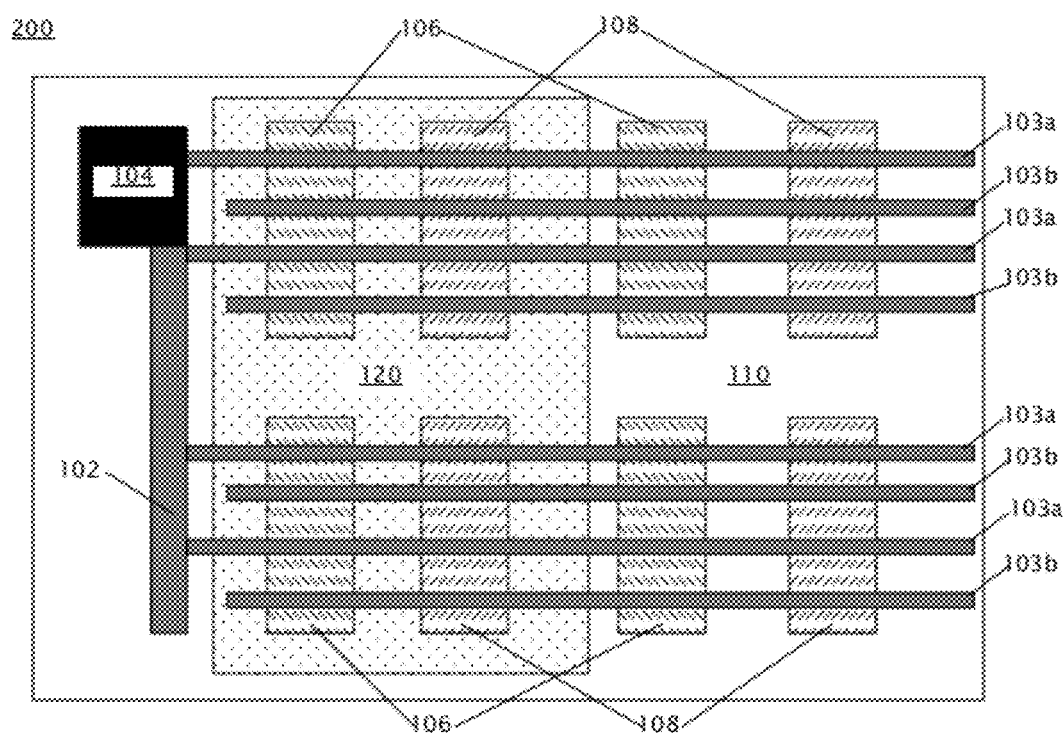
FIG. 2 is a diagram illustrating a top-down view of a semiconductor structure including a voltage contrast test structure that can be implemented within embodiments of the present invention.

FIG. 2 is a top-view diagram illustrating a semiconductor structure 200 including a voltage contrast (VC) test structure that may be implemented within embodiments of the present invention. VC inspection is a technique for detecting and isolating yield limiting defects in the semiconductor fabrication industry. VC inspection includes scanning the wafer surface in which the test structures is implemented with a scanning electron microscope (SEM). As the VC inspection proceeds, the SEM induces a charge on all electrically floating elements, whereas any grounded elements remain at zero potential. This potential difference is visible to the SEM. In particular, grounded elements appear bright whereas floating elements appear dark under SEM inspection, allowing detection of electrical opens in gate lines that are connected to a ground connection but appear dark under SEM inspection. The electrical opens indicate gaps in the conductive layer in the semiconductor structure 200.

As shown in FIG. 2, a top-view of the semiconductor structure 200 including a VC test structure is provided according to an embodiment of the present invention. The semiconductor structure 200 includes active regions 106 and 108 formed in a semiconductor substrate (such as semiconductor substrate 10 of FIGS. 1a-b). Active regions 106 may have a doping type (n-type or p-type) that is opposite to a doping type of active regions 108 in various embodiments, and may be used to form any appropriate type of semiconductor device, including but not limited to field effect transistors (FETs). The active regions 106 and 108 in the semiconductor substrate are separated and surrounded by passivation regions, which may include field oxide or shallow trench isolation (STI) regions.

The test structure is located on top of the semiconductor substrate, and includes a multilayer gate stack 102 (such as described above with respect to FIG. 1) in the shape of a plurality of gate lines 103a and 103b. Referring back to FIGS. 1a-b, the multilayer gate stack 102 that comprises the test structure includes dielectric layer 11, conductive layer 12, amorphous silicon layer including undoped amorphous silicon layer 14 and doped amorphous silicon layer 20, and silicide cap layer 16. Gate lines 103a are grounded by ground 104 (i.e., grounded elements) while the gate lines 103b are floating (i.e., floating elements). Ground 104 may include a connection to the semiconductor substrate or a capacitor in some embodiments. In some embodiments of the a VC test structure, floating gate lines 103b may be omitted, and only grounded gate lines 103a may be present. During VC testing of the semiconductor structure 200, the semiconductor structure 200 is scanned with an inspection SEM, and a gap 24 in the conductive layer 12 in single conductive layer regions 120 may be detected in a grounded gate line 103a that appear dark under the SEM inspection.

Further shown in FIG. 2, the semiconductor structure 200 includes tapped region 110, and single conductive layer region 120. Each of tapped region 110 and single conductive layer region 120 may include any appropriate number of active regions 106/108 separated by passivation regions formed in the semiconductor substrate 10. During fabrication, a mask (not shown) is used to block the formation of silicide cap layer 16 and the implantation of dopants to form doped amorphous silicon layer 20 in single conductive layer region 120; therefore, in single conductive layer region 120, the multilayer gate stack 102 comprises undoped amorphous silicon layer 14 on top of conductive layer 12 or gap(s) 24 (as shown in FIGS. 1a-b). Therefore, the lowest resistance path in single conductive layer region 120 is through the conductive layer 12. In tapped region 110, the additional conductive layers, including doped amorphous silicon 20 and top silicide cap layer 16, are present on top of conductive layer 12. Taps 22 to silicide cap layer 16 (as shown in FIGS. 1a-b) at which a voltage contrast signal may be measured are also present in tapped region 110. The semiconductor structure 200 including the test structure as shown in FIG. 2 is shown for illustrative purposes only; a test structure may be implemented in any semiconductor structure including any number of tapped regions and single conductive layer regions, which may each in turn include any number and type of active regions separated by passivation regions.

Figure 3:
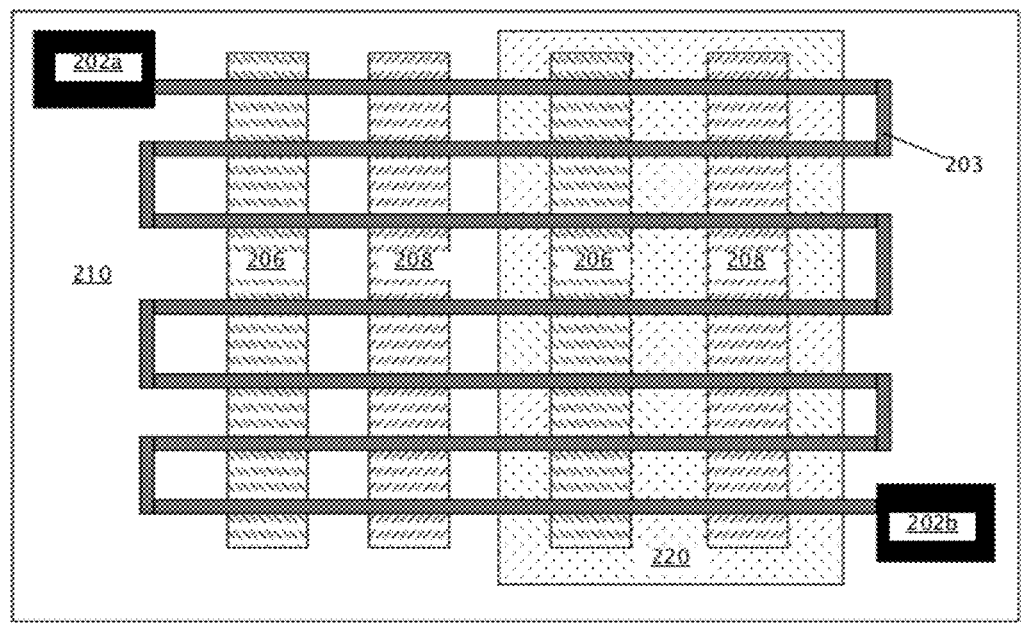
FIG. 3 is a diagram illustrating a top-down view of a semiconductor structure including a probable test structure that can be implemented within embodiments of the present invention.

FIG. 3 is a top-view diagram illustrating a semiconductor structure 300 including a probable test structure that may be implemented in another embodiment of the present invention. As shown in FIG. 3, the test structure includes contact pads 202a-b, and a single line of multilayer gate stack 203 connected between the contact pads 202a-b. Multilayer gate stack 203 goes through tapped region 210 and single conductive layer region 220. The multilayer gate stack 203 comprises a similar structure to multilayer gate stack 102 of in FIG. 2. Referring to FIGS. 1a-b, in tapped region 201, multilayer gate stack 203 includes doped amorphous silicon layer 20 and silicide cap layer 16; in single conductive layer region 220, multilayer gate stack 210 includes undoped amorphous silicon layer 14. A mask may be used to prevent dopant implantation and silicide formation in region 220 during fabrication of the semiconductor structure 300. Further, as shown in FIG. 3, semiconductor structure 300 includes first active regions 206 and second active regions 208 separated by passivation regions formed within a semiconductor substrate 10 (of FIGS. 1a-b). Multilayer gate stack 203 is located over the semiconductor substrate 10. Active regions 106 may have an opposite doping type (n-type or p-type) to active regions 108 in some embodiment. During probable testing of semiconductor structure 300, a resistance is measured between the contact pads 202a-b to determine whether an electrical open (i.e., a gap such as gap 24 of FIG. 1b) exists in conductive layer 12 in single conductive layer region 220. If the resistance measured between contact pads 202a-b is high, then an electrical open indicating a gap in the conductive layer is detected.

The serpentine-shaped line of multilayer gate stack 203 is shown for illustrative purposes only; a multilayer gate stack connected between two contact pads such as is shown in FIG. 3 may be any appropriate shape. Further, the semiconductor structure 300 including the test structure as shown in FIG. 3 is shown for illustrative purposes only; a test structure may be implemented in any semiconductor structure including any number of tapped regions and single conductive layer regions, which may each in turn include any number and type of active regions separated by passivation regions. The tapped region 110 may also be omitted in some embodiments of a probable test structure including a single line of multilayer gate stack between two contact pads such as is shown in FIG. 3. In such an embodiment, the single conductive layer region 220 may cover all of the semiconductor substrate.

FIG. 4 illustrates an embodiment of a method 400 of detecting a gap in a conductive layer in a multilayer gate stack via VC inspection. In block 401, a test structure including a multilayer gate stack, the multilayer gate stack including the conductive layer (as described with respect to FIGS. 1a-b), is formed on a semiconductor substrate. The semiconductor substrate may include active regions separated by passivation regions in some embodiments. The multilayer gate stack may be configured as a plurality of gate lines, such as is shown in FIG. 2. At least one of the multilayer gate stack lines are connected to a ground connection, such as gate lines 103a of FIG. 2. In block 402, a charge is induced in the grounded multilayer gate stack lines. The charge may be induced by scanning the semiconductor structure and multilayer gate stack with a SEM. The SEM induces a charge in any electrically floating elements, whereas any grounded elements remain at zero potential. This potential difference is visible to the SEM. In particular, grounded elements appear bright whereas floating elements appear dark under SEM inspection. In block 403, the induced charge is used to detect gaps in the conductive layer of the multilayer gate stack. In particular, gaps in the conductive layer of the multilayer gate stack are detected in any gate lines that are grounded but appear dark under SEM inspection.

Figure 5:
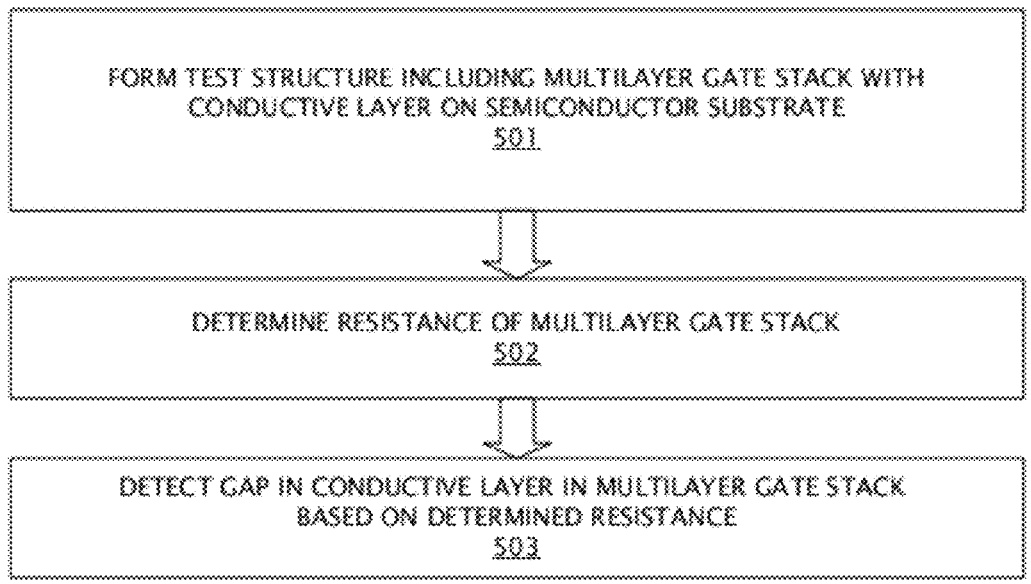
FIG. 5 is a flowchart illustrating an embodiment of a method of detecting a gap in a conductive layer in a multilayer gate stack in a semiconductor structure via probable testing.

FIG. 5 illustrates an embodiment of a method 500 of detecting a gap in a conductive layer in a multilayer gate stack via probable testing. In block 501, a test structure including a multilayer gate stack, the multilayer gate stack including the conductive layer (as described with respect to FIGS. 1a-b), is formed on a semiconductor substrate. The semiconductor substrate may include active regions separated by passivation regions in some embodiments. The multilayer gate stack may be configured as a single line between two contact pads, as is shown in FIG. 3. In block 502, a resistance of the test structure is measured. For example, the resistance of the multilayer gate stack 203 between the contact pads 202a-b as shown in FIG. 3 may be measured. In block 503, it is determined whether an electrical open exists in the conductive layer of the multilayer gate stack based on the measured resistance. If the resistance between the contact pads 202a-b is measured as high, then an electrical open, and a gap in the conductive layer, is detected in the conductive layer of the multilayer gate stack.

Embodiments of the present invention provide the advantages of being able to detect missing conductive layer more efficiently during a semiconductor fabrication process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of detection of a gap in a conductive layer of a semiconductor structure, comprising:
    forming a test structure on a semiconductor substrate, the test structure comprising a multilayer gate stack, wherein the multilayer gate stack includes a single conductive layer region including:
        a gate dielectric located on the semiconductor substrate;
        the conductive layer located on the gate dielectric; and
        an undoped amorphous silicon layer located on the conductive layer;
    inducing a charge in the test structure; and
    detecting the presence of the gap in the conductive layer using the charge induced in the test structure.

2. The method of claim 1, wherein forming the test structure comprises configuring the test structure as a plurality of lines, each of the plurality of lines comprising the multilayer gate stack, and wherein at least one of the plurality of lines are connected to a ground connection.

3. The method of claim 2, wherein the charge is induced in the at least one line connected to the ground connection.

4. The method of claim 3, wherein the charge is induced using a scanning electron microscope.

5. The method of claim 4, wherein the presence of the gap is detected in the event a line that is connected to the ground connected appears dark during scanning with the SEM.

6. A method of detection of a gap in a conductive layer of a semiconductor structure, comprising:
   forming a test structure on a semiconductor substrate, the test structure comprising a multilayer gate stack, wherein the multilayer gate stack includes a single conductive layer region including:
      a gate dielectric located on the semiconductor substrate;
      the conductive layer located on the gate dielectric; and
      an undoped amorphous silicon layer located on the conductive layer;
   determining a resistance of the multilayer gate stack of the test structure; and
   detecting the gap based on the determined resistance.

7. The method of claim 6, wherein forming the test structure comprises forming a single line comprising the multilayer gate stack, the single line being electrically connected between a first contact pad and a second contact pad.

8. The method of claim 7, wherein the gap in the conductive layer is detected by measuring the resistance of the multilayer gate stack between the first contact pad and the second contact pad.

* * * * *